United States Patent [19]

Miyamoto et al.

[11] Patent Number: 4,642,673

[45] Date of Patent: Feb. 10, 1987

[54] FLOATING GATE TYPE EEPROM WITH A SUBSTRATE REGION USED FOR THE CONTROL GATE

[75] Inventors: Junichi Miyamoto, Yokohama; Tetsuya Iizuka, Funabashi, both of Japan

[73] Assignee: Tokyo Shibaura Denki Kabushiki Kaisha, Tokyo, Japan

[21] Appl. No.: 582,604

[22] Filed: Feb. 22, 1984

[30] Foreign Application Priority Data

Feb. 25, 1983 [JP] Japan .................................. 58-30355

[51] Int. Cl.⁴ ..................... H01L 29/78; H01L 29/94; H01L 29/46
[52] U.S. Cl. .................................... 357/23.5; 357/41; 357/59; 365/185
[58] Field of Search ........................ 357/23.5, 41, 59; 365/185

[56] References Cited

U.S. PATENT DOCUMENTS

| | | | |
|---|---|---|---|
| 3,919,711 | 11/1975 | Chou | 357/23.5 |
| 4,019,197 | 4/1977 | Lohstroh et al. | 357/23 |
| 4,288,863 | 9/1981 | Adam | 365/185 |
| 4,379,343 | 4/1983 | Moyer | 357/23.5 |
| 4,402,064 | 8/1983 | Arakawa | 357/23.5 |
| 4,404,577 | 9/1983 | Cranford et al. | 357/23.5 |
| 4,425,631 | 1/1984 | Adam | 357/23.5 |

FOREIGN PATENT DOCUMENTS

| | | | |
|---|---|---|---|
| 0049392 | 4/1982 | European Pat. Off. | 357/23.5 |
| 3009719 | 9/1980 | Fed. Rep. of Germany | 357/23.5 |

OTHER PUBLICATIONS

Kuo et al., "An 80 ns 32K EEPROM Using the FETMOS Cell," IEEE Journal of Solid-State Circuits, vol. SC-17, No. 5, Oct. 1982.

*Primary Examiner*—Andrew J. James
*Assistant Examiner*—Charles S. Small, Jr.
*Attorney, Agent, or Firm*—Finnegan, Henderson, Farabow, Garrett & Dunner

[57] ABSTRACT

A semiconductor memory device having a floating gate transistor and an insulated gate transistor, is provided a p-type semiconductor substrate, first, second and third semiconductor regions which are formed in the surface area of the substrate, a floating gate electrode capacitively coupled through a first insulating layer to a current path including the first and second semiconductor regions, a control gate electrode capacitively coupled through a second insulating layer to the floating gate electrode, and an insulated gate electrode which is formed through a first insulating layer on that portion of the substrate which lies between the second and third semiconductor regions. The first insulating layer of the semiconductor memory device is formed on that portion of the substrate which lies between the first and second semiconductor regions. The control gate electrode is a fourth semiconductor region which is formed in the surface area of the substrate. A second insulating layer is formed of a very thin monocrystalline oxide layer, and is formed on the fourth semiconductor region. The current path of the floating gate transistor is perpendicular to that of the insulated gate transistor substantially in the same plane.

13 Claims, 11 Drawing Figures

FLOATING GATE TYPE EEPROM WITH A SUBSTRATE REGION USED FOR THE CONTROL GATE

BACKGROUND OF THE INVENTION

The present invention relates to a semiconductor memory device as a memory cell of an electrically erasable and programable read-only memory (EEPROM).

Significant development has been made in EEPROMs due to their unique non-volatility and in-system reprograming capability. An EEPROM generally has a number of memory cells arranged in a matrix form; each memory cell stores either logic value "H" or "L". FIG. 1 shows a conventional memory cell which uses a Fowler-Nordheim tunneling current for programing and erasing information. Such a memory cell is introduced, for example, in IEEE J. of Solid-State Circuits. Vol. SC-17, No. 5, Oct. 1982, p. 821. This memory cell has a transistor 10 having a floating gate for charging carriers and a transistor 12 rendered conductive when the memory cell is used. FIG. 2 is a plan view showing the arrangement of the memory cell, and FIG. 3 is a cross-sectional view along the line I—I in FIG. 2. The memory cell has n-type semiconductor regions 16, 18 and 20 formed in the surface area of a p-type semiconductor substrate 14. A channel region 24 is present between the regions 16 and 18, and the regions 16, 24 and 18 constitute a current path of the transistor 10 (FIG. 1). A channel region 26 is present between the regions 18 and 20, and the regions 18, 26 and 20 constitute a current path of the transistor 12 (FIG. 1). The channel region 24 is covered with a thin insulating layer 28 for tunneling carriers. A conductive layer 30 used as a floating gate of the transistor 10 is formed on the layer 28. The conductive layer 30 extends in a direction perpendicular to the direction of arrangement of the regions 16, 24 and 18, as shown in FIGS. 2 and 3. The conductive layer 30 is covered with an insulating layer 32 through which the carriers cannot tunnel. A conductive layer 34 used as a control gate of the transistor 10 is formed on the insulating layer 32 so as to overlap the conductive layer 30. A conductive layer 38 used as a select gate of the transistor 12 is formed on the channel region 26 through an insulating layer 36 having a thickness of about 700 Å. The regions 16, 24, 18, 26 and 20 are arranged in a line in the surface area of the substrate 14. The semiconductor regions 16 and 20 are respectively connected to a common source line and a bit line (not shown), and the layers 34 and 38 are respectively connected to a control line and a word line (not shown).

In the erasing operation of the memory cell, while the transistor 12 is rendered conductive by a voltage from the word line, a low level voltage (0 V) is applied to the drain of the transistor 10 through the bit line, and a high level voltage (20 V) is applied to the control gate of the transistor 10 through the control line. Carriers are then accumulated in the floating gate of the transistor 10 increasing the threshold voltage of the transistor 10.

In the programing operation, while the transistor 12 is rendered conductive by a voltage applied through the word line, a high level voltage (20 V) is applied to the drain of the transistor 10 through the bit line, and a low level voltage (10 V) is applied to the control gate of the transister 10 through the control line. Then, the carriers are discharged from the floating gate of the transistor 10, and the threshold voltage of the transistor 10 is decreased.

The floating gate voltage VFG of the transistor 10 is given by the following approximation (see FIG. 4):

$$VFG \approx (CT2 \cdot VG + CT1 \cdot VC)/(CT1 + CT2) + QF/(CT1 + CT2) \quad (1)$$

where
- CT1: capacitance between the channel region 24 and the floating gate 30
- CT2: capacitance between the floating gate 30 and the control gate 34
- QF: charge amount in the floating gate 30
- VG: control gate voltage
- VC: drain voltage When it is assumed that QF=0 (C) and VC=0 (V), the floating gate voltage VFG1 when erasing is initiated is given by:

$$VFG1 = (CT2 \cdot VG)/(CT1 + CT2) \quad (2)$$

When it is assumed that VG=0 (V), the floating gate voltage VFG2 when programing is started is given by:

$$VFG2 = (CT1 \cdot VC)/(CT1 + CT2) + QF/(CT1 + CT2) \quad (3)$$

In order that the memory cell operate properly, the value of VFG1 is preferably large and the value of VFG2 is preferably small. Especially when the high and low levels of the control gate voltage VG, and the high and low levels of the drain voltage VC are set to be equal to each other, the following relation must be satisfied:

$$CT2 >> CT1 \quad (4)$$

Generally, the ratio CT2/CT1 is 2 to 3. The smaller the level ranges between high and low levels of the control gate voltage VG and of the drain voltage VC, respectively, the smaller the transistor elements. Then, the operation reliability and manufacturing yield of EEPROMs as LSIs are improved.

The density JFN of tunnel current flowing through the thin insulating layer 28 is given by:

$$JFN = (q^3 E^2/8\pi h\phi) \exp(-4(2m)^{\frac{1}{2}}\phi^{3/2}/3hqE) \quad (5)$$

where
- q: charge
- h: Planck's constant
- φ: band gap
- m: electron mass
- E: electric field in layer 28

The density JFN of tunnel current increases proportionally with the electric field E. The condition for charging the carriers in the floating gate 30 is that the absolute value of a current I1 flowing in the insulating layer 28 is larger than that of a current I2 flowing in the insulating layer 32 ($|I1| > |I2|$). Then, the absolute value of an electric field E1 in the insulating layer 28 must be larger than that of an electric field E2 in the insulating layer 32 ($|E1| > |E2|$).

When VC=0 (V) and QF=0 (V), the ratio E1/E2 is given by:

$$E1/E2 = (d2/d1) \cdot (VFG - 0)/(VG - VFG) \quad (6)$$

$$= (d2/d1) \cdot (CT2/CT1)$$

-continued $$= 1 + AT2/AT1 \gg 1$$

where
- d1: thickness of insulating layer 28
- d2: thickness of insulating layer 32
- AT1: area of that portion of conductive layer 30 which is overlapped with channel region 24 through insulating layer 28
- AT2: area of that portion of conductive layer 30 which is not overlapped with channel region 24 through insulating layer 28.

In the relation (6) above, the condition $CT2 \gg CT1$ is applied utilizing the relation $C = \epsilon A/d$ (where C: capacitance; $\epsilon$: dielectric constant; A: area of conductor; and d: thickness of insulator).

In the memory cell as described above, the insulating layer 28 is formed of monocrystalline silicon having a thickness of about 100 Å so that many carriers can tunnel through the layer 28 upon application of a floating gate voltage of about 20 V. The conductive layer 30 is formed of polycrystalline silicon. The insulating layer 32 is formed of polycrystalline silicon oxide and has a thickness of about 800 Å.

The crystal grain orientation in the layers 30 and 32 is largely dependent on the manufacturing process, and considerable asperity is present at the interface between the layers 30 and 32. Since the asperity accelerates concentration of an electric field, the tunnel current is affected thereby, as may be seen from the relation (6) above. Thus, the memory cell as described above has low reliability with respect to its electrical characteristics, and presents a problem of low yield in the manufacture of EEPROMs.

When the thickness of the insulating layer 32 is set to be less than 800 Å, the above problems become more serious, and an improvement in the cell density cannot be expected with the same design rule. For example, when a memory cell having a ratio CT2/CT1 of about 2.7 is laid out in accordance with the 2 $\mu$m design rule as shown in FIG. 5, the memory cell including the transistor 12 requires an area of 272 $\mu$m$^2$. An area AT1+AT2 of the conductive layer 30 as the floating gate is obtained as follows:

$$(AT1+AT2)/AT1=21.6$$

$AT1 = W \times L = 2 \times 1.5 = 3[\mu m^2]$, (W: channel width, L: channel length)

$AT1+AT2 = AT1 \times 21.6 = 3 \times 21.6 = 64.8[\mu m^2]$

SUMMARY OF THE INVENTION

It is an object of the present invention to provide a semiconductor memory device which has a high packaging density under the same design rule and which is not liable to any adverse effects from changes in a manufacturing process.

According to the present invention, there is provided a semiconductor memory device comprising: a semiconductor substrate of one conductivity type; first and second semiconductor regions of an opposite conductivity type which are formed in the surface area of the substrate; a first insulating layer formed on that portion of the semiconductor substrate which lies between the first and second semiconductor regions; a third semiconductor region of the opposite conductivity type which is formed in the surface area of the substrate to constitute a control gate electrode of a floating gate transistor; a second insulating layer formed on the third semiconductor region; a floating gate electrode of the floating gate transistor formed on the first and second insulating layers; and means for applying a potential between the second and third semiconductor regions to cause charge carriers to tunnel to and from the floating gate electrode through the first insulating layer.

According to the present invention, the amount of charge carriers stored in the floating gate electrode is determined in accordance with the ratio of the capacitance of the floating gate and that portion of the semiconductor substrate which lies between the first and second semiconductor regions to the capacitance of the third semiconductor region and the floating gate. That portion of the floating gate electrode which defines the former capacitance has a small area. Accordingly, even if the third semiconductor region has only a small area, a sufficient amount of charge carriers can be stored in the floating gate electrode.

DETAILED DESCRIPTION OF THE PREFERRED EMBODIMENTS

Figure 1:
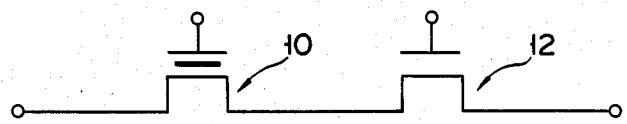
FIG. 1 is a circuit diagram of a conventional EEPROM memory cell.
Figure 2:
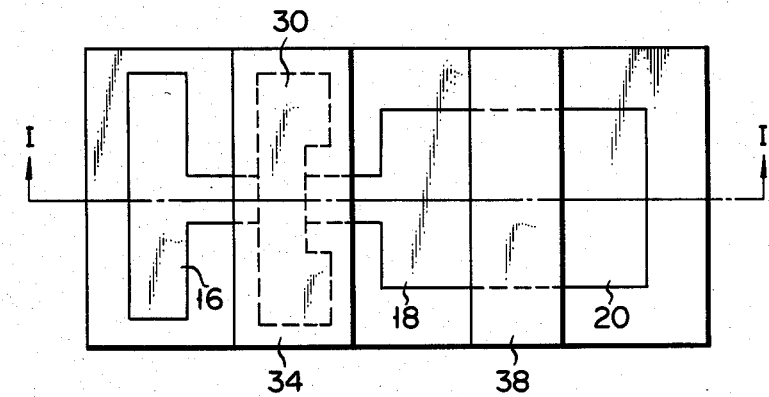
FIG. 2 shows a schematic top plan pattern of the memory cell shown in FIG. 1.
Figure 3:
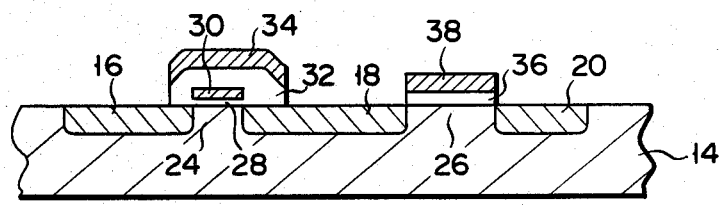
FIG. 3 is a cross-sectional view showing the structure of the memory cell shown in FIG. 1 along the line I—I shown in FIG. 2.
Figure 4:
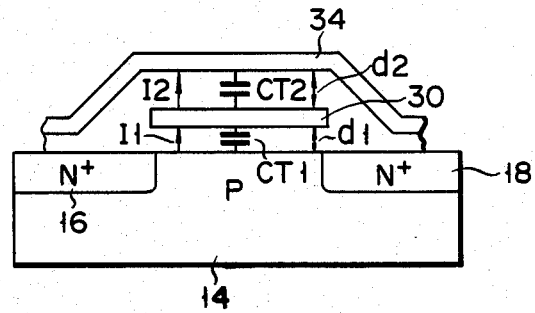
FIG. 4 is a representation for explaining the electrical characteristics of a floating gate transistor shown in FIG. 1.
Figure 5:
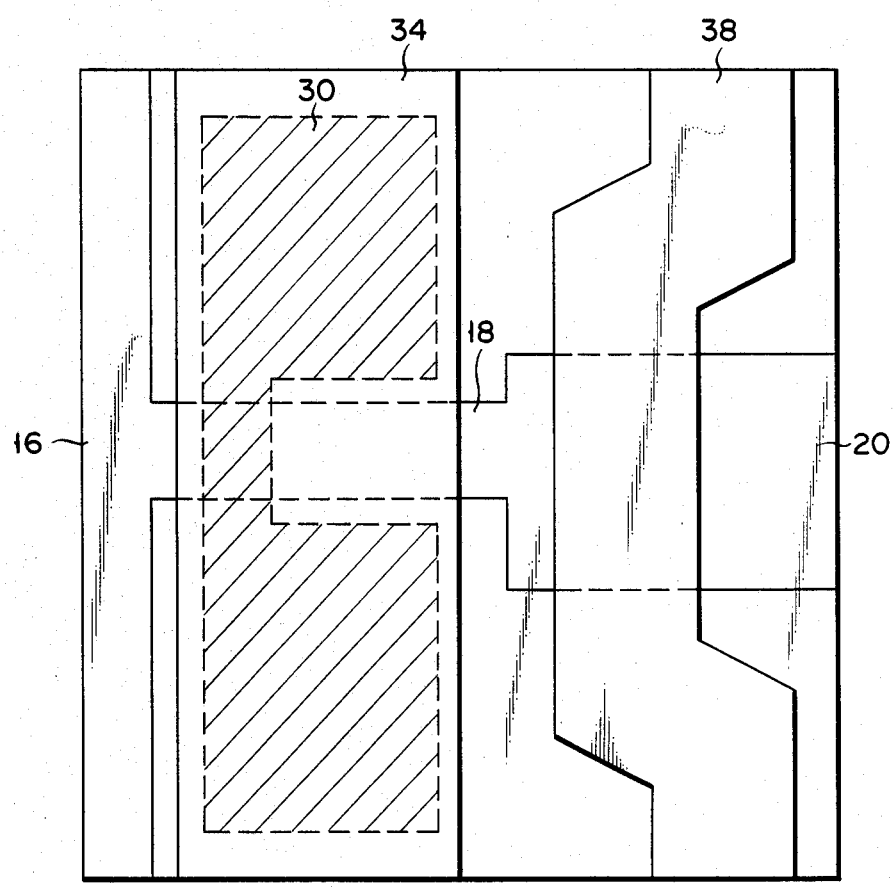
FIG. 5 is a top plan view of the memory cell shown in FIG. 1 laid out in accordance with the 2 $\mu$m design rule.
Figure 6:
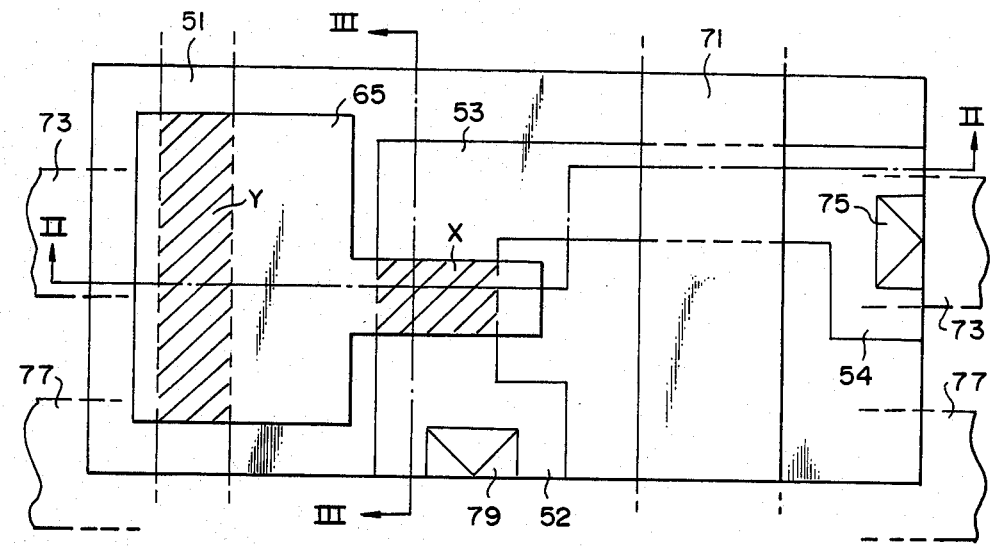
FIG. 6 shows a schematic top plan pattern of a semiconductor memory device according to an embodiment of the present invention, which is laid out in accordance with the 2 $\mu$m design rule.
Figure 7:
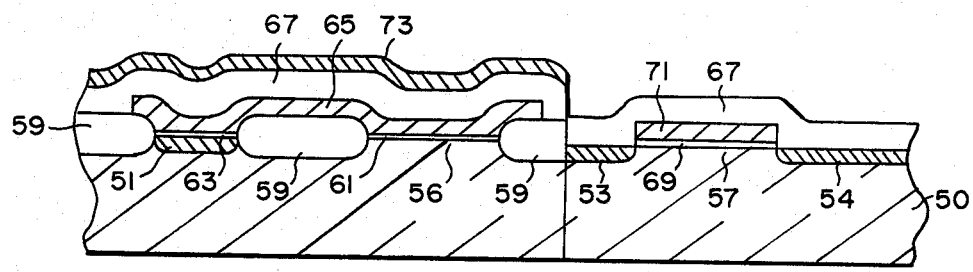
FIG. 7 is a cross-sectional view showing the structure of the memory device shown in FIG. 6 along the line II—II therein.
Figure 8:
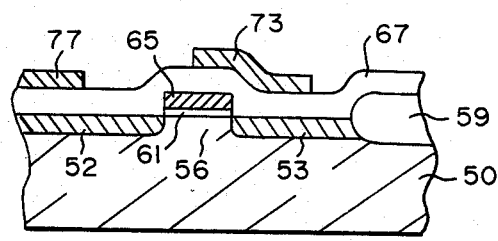
FIG. 8 is a cross-sectional view showing the structure of the memory device shown in FIG. 6 along the line III—III therein.

A semiconductor memory device according to an embodiment of the present invention will be described with reference to FIGS. 6 to 8. The memory device has a floating gate transistor and an insulated gate transistor, and constitutes one of the EEPROM memory cells which are arranged in a matrix form. FIG. 6 is a top plan view of a memory device which is laid out in accordance with, for example, the 2 μm design rule. Note that in this figure part of the surface of the device is omitted so as to effectively illustrate the internal plane pattern. FIG. 7 is a cross-sectional view showing the section of the memory device shown in FIG. 6 along the line II—II therein. FIG. 8 is a cross-sectional view showing the section of the memory device shown in FIG. 6 along the line III—III therein.

The memory device shown in FIGS. 6 to 8 has a semiconductor substrate 50 formed of p-type silicon. n+-type semiconductor regions 51 to 54 are formed at intervals in the surface area of the substrate 50. The region 51 is a control gate electrode of a floating gate transistor and extends in one direction as shown in FIG. 6. The current path of the floating gate transistor is constituted by the regions 52 and 53, and a channel region 56 which is a part of the p-type semiconductor substrate 50 between the regions 52 and 53. This current path extends parallel to the region 51, as shown in FIG. 6. The current path of an insulated gate transistor is constituted by the regions 53 and 54 and a channel region 57 which is a part of the p-type semiconductor substrate 50 between the regions 53 and 54. This current path extends perpendicularly to the current path of the floating gate transistor, as shown in FIG. 6. The regions 51 to 54 are selectively isolated from each other in the surface area of the substrate 50 by insulating regions 59 formed of silicon oxide. An insulating layer 61 of monocrystalline silicon oxide is formed on the channel region 56. The layer 61 is very thin; it has a thickness of, for example, 100 Å. An insulating layer 63 of monocrystalline silicon oxide is formed on the region 51. The layer 63 is also very thin and may have a thickness substantially the same as that of the layer 61. A conductive layer 65 used as a floating gate electrode of the floating gate transistor is formed on the insulating regions 59, and the insulating layers 61 and 63 so as to overlap the regions 56 and 51 through the layers 61 and 63. The conductive layer 65 is formed of polycrystalline silicon and can store carriers tunneling through the insulating layer 61. The conductive layer 65 is covered with a CVD insulating layer 67 formed of a polycrystalline oxide and having a thickness such that the charge carriers cannot escape to the outside from the conductive layer 65. A conductive layer 71 is formed of polycrystalline silicon and is formed on the channel region 57 through an insulating layer 69. The conductive layer 71 is a gate electrode of the insulated gate transistor and extends parallel to the region 51, as shown in FIG. 6. The insulating layer 67 further covers the entire surfaces of the conductive layer 71 and the substrate 50. The semiconductor region 54 is connected through a contact hole 75 to a bit line 73 which extends perpendicularly to a current path of the floating gate transistor, as shown in FIG. 6. The semiconductor region 52 is connected through a contact hole 79 to a source line 77 which is parallel to the bit line 73. The bit line 73 and the source line 77 are formed of, for example, aluminum. A control line and a word line (not shown) are respectively connected to the semiconductor region 51 and the conductive layer 71.

When memory devices having the same configuration as that of the memory device shown in FIG. 6 are linearly arranged to constitute an EEPROM, the semiconductor region 51 and the conductive layer 71 are respectively used as a control line and a word line common to all these memory devices.

The operation of the semiconductor memory device as described above will now be described. In the erasing operation, while the insulated gate transistor is rendered conductive by a voltage applied through the word line, a high level voltage (20 V) is applied to the region 51 through the control line, and a low level voltage (0 V) is applied to the region 54 through the bit line. Then, the carriers tunneling through the insulating layer 61 are charged in the conductive layer 65 to increase the threshold voltage of the floating gate transistor. This operation amounts to the storage of logic value "L" in the memory device.

In the programming operation, while the insulated gate transistor is rendered conductive by a voltage applied through the word line, a low level voltage (0 V) is applied to the region 51 through the control line, and a high level voltage (20 V) is applied to the region 54 through the bit line. Then the carriers in the conductive layer 65 tunnel through the insulating layer 61 into the channel region 56 to decrease the threshold voltage of the floating gate transistor. This operation amounts to storage of high value "H" in the memory device.

Note that when the insulated gate transistor is nonconductive the potentials of the regions 51 and 53 are set to be the same so that the carriers in the conductive layer 65 may not be mobilized.

In the embodiment described above, a part X of the conductive layer 65 which is overlapped with the channel region 56 through the insulating layer 61, and a part Y of the conductive layer 65 which is overlapped with the semiconductor region 51 through the insulating layer 63 are hatched in FIG. 6, respectively. The areas of the parts X and Y of an actual memory device were measured to be 9.75 [μm$^2$] and 3 [μm$^2$], respectively. Since the insulating layers 61 and 63 have the same thickness, the ratio CT2/CT1 can be calculated as follows:

$$CT2/CT1 = (\text{area of part } Y)/(\text{area of part } X)$$

$$= 9.75/3 = 3.25$$

The overall area of the memory device was 149 [μm$^2$] which is about 45% of the conventional area, with the same design rule.

Since the area of the insulating layer 61 on the channel region 56 is narrow, the capacitance between the conductive layer 65 and the channel region 56 is small. Instead of polycrystalline material, the insulating layer 61 is formed of monocrystalline silicon oxide which is less subject to any adverse effects of changes in the manufacturing process. Thus, the layer 61 can be made very thin. Accordingly, the conductive layer 65 of only a small area need be formed so as to store a given amount of carriers, and the area of the part Y of the conductive layer 65 can be reduced.

Since the layers 61 and 63 or layers 65 and 71 can be formed in a single step, reliable memory devices can be manufactured with a good reproduction characteristics. In other words, a high manufacturing yield of semiconductor memory devices is obtained.

Figure 9:
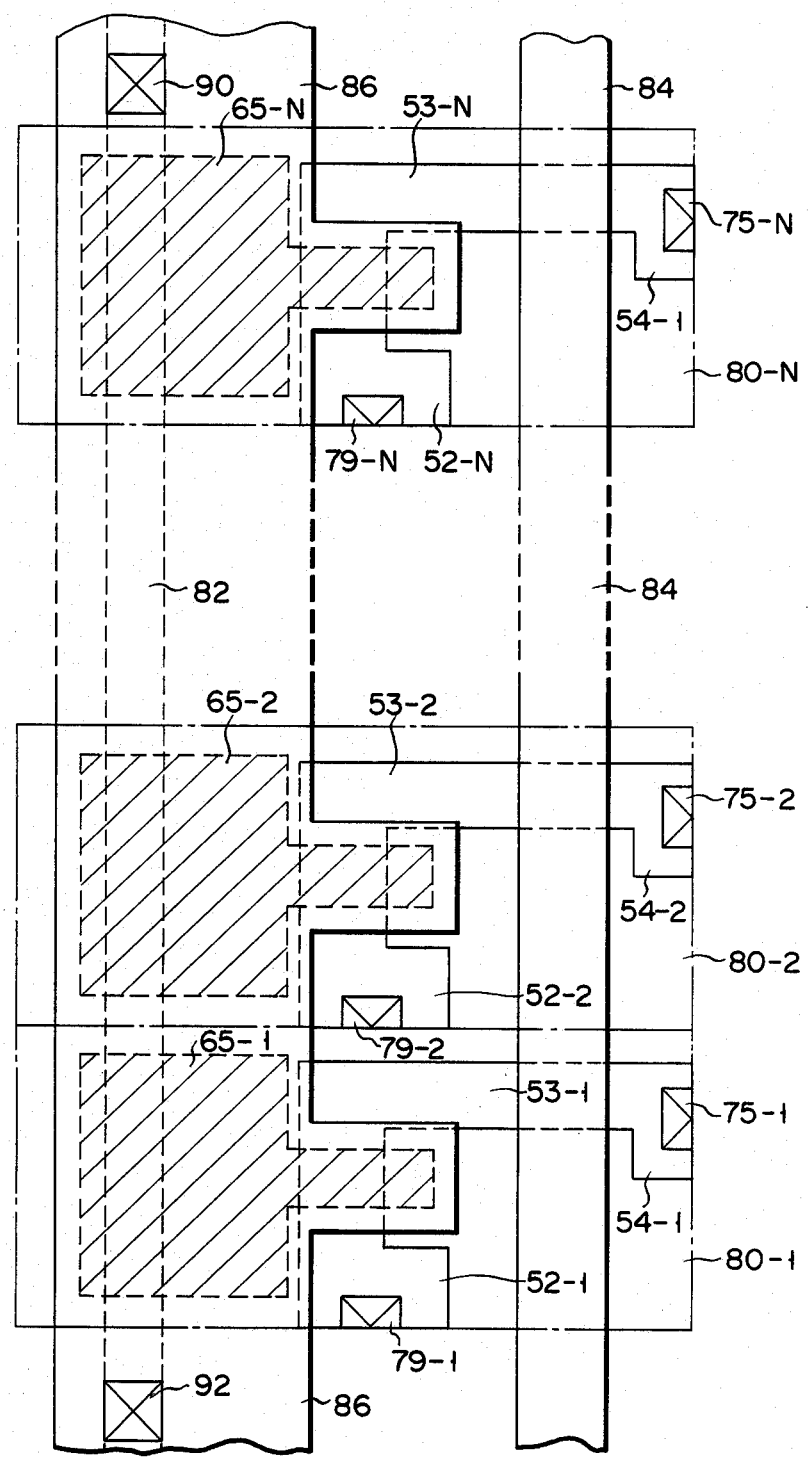
FIG. 9 is a top plan view of a semiconductor memory device according to another embodiment of the present invention, wherein an additional control gate is provided to the memory device shown in FIG. 6.

FIG. 9 shows a top pattern of a semiconductor memory device according to still another embodiment of the present invention. The memory device has a plurality of memory cells 80-1 to 80-N for storing 1-word information. Each of the memory cells 80-1 to 80-N has a configuration similar to that shown in FIG. 6 except in the following respects. The memory cells 80-1 to 80-N have a common p-type semiconductor substrate (not shown). An n+-type semiconductor region 82 is a control gate electrode which is common to the floating gate transistors of all the memory cells 80-1 to 80-N. A conductive layer 84 is an insulated gate electrode which is common to the insulated gate transistors of all the memory cells 80-1 to 80-N. A conductive layer 86 covers the memory cells 80-1 to 80-N through an insulating layer (not shown). The conductive layer 86 is connected to the semiconductor region 82 through contact holes 90 and 92. The semiconductor region 82 and the conductive layer 86 are formed linearly and are parallel to each other.

With the structure as described above, the sheet resistance of the conductive layer 86 is reduced to about ½ to ⅓ of that of the semiconductor region 82, and the RC delay is reduced. Accordingly, the erasing operation in which high voltage is applied to the region 82 is shortened.

Since the conductive layer 86 is additionally formed, the charge storage capacity of conductive layers 65-1 to 65-N is increased. The area of the memory cell can therefore be deceased further.

The conductive layer 86 also serves to protect the conductive layers 65-1 to 88-N and to thereby improve the reliability of the memory cells.

In the embodiment, the insulating layers 61 and 63 are formed silicon oxide. However, the insulating 61 and 63 may be formed of silicon nitride or the like.

In the above-mentioned embodiment, the insulating layer 63 is formed to have a very small thickness nearly the same as that of the insulating layer 61, permitting tunnel current to flow through the layer 63. The effect of the tunnel current on the static characteristic of the memory device is found by substituting actual values for the variables in Equations (3) and (5) and the following equation:

$$\frac{dQF}{dt} = AT1 \times JFN(E1) - AT2 \times JFN(E2)$$

Note that the general equation represents an amount of change of the charge with respect to time.

Figure 10:
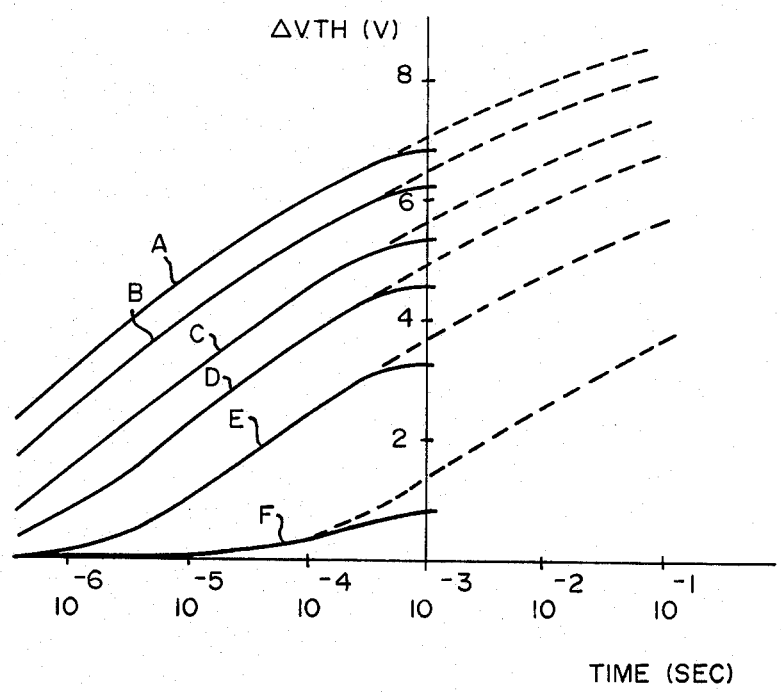
FIG. 10 shows a relation of a difference $\Delta VTH$ between the threshold voltages of the floating gate transistor after the programing and erasing steps with respect to the write period of EEPROM.

FIG. 10 shows a relation of a difference ΔVTH between the threshold voltages of the floating gate transistor after the programming and erasing steps with respect to the write period of EEPROM, which has been obtained, for example, at d1=100 Å, AT1=1 μm² and AT2/AT1=2 to 10. In FIG. 10, A to F show the cases when the values of AT2/AT1 are "10", "7", "5", "4", "3" and "2", respectively, noting that the solid line and broken line show the presence and absence of the tunnel current through the layer 63, respectively.

That is, when the tunnel current flows through the insulating layer 63 as in the above-mentioned embodiment, the difference ΔVTH will be decreased. However, no marked decrease is produced if the write period of EEPROM is shorter than 1 ms. In this connection it is to be noted that in the modern semiconductor manufacturing technique the write period of EEPROM is already of the order of below 1 ms. Except, therefore, that the RC delay time is relatively great in comparison with the write period of time, EEPROM will be operated stably even if the insulating layer 63 is formed to have a smaller extent of thickness. The insulating layers 61 and 63 are formed to have the same thickness in the above-mentioned embodiment, this can be attained, for example, at the step by simultaneously oxidizing the regions 56, 51 to form the layer 61 and 63. In the second embodiment, if the RC delay time is set small enough to be disregarded in comparison with the write period of time, it is possible to omit the conductive layer 86.

Figure 11:
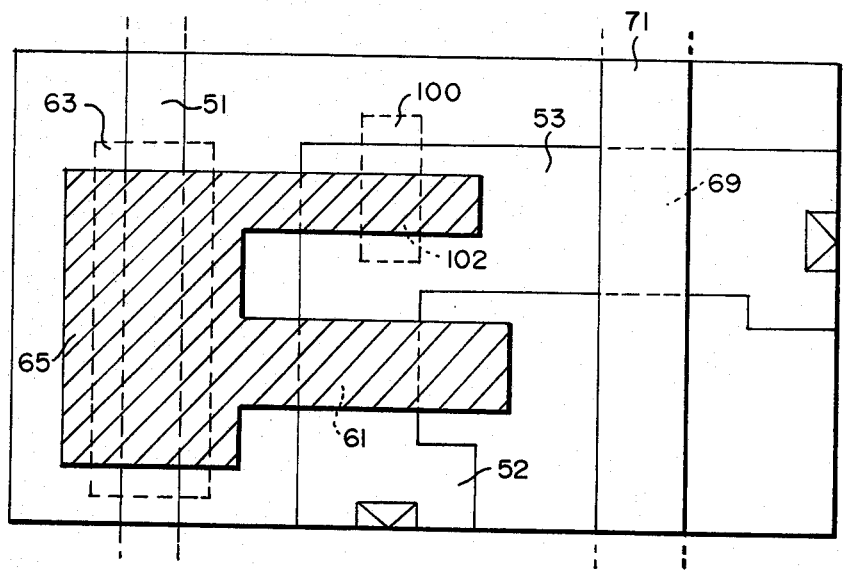
FIG. 11 shows a shematic top plan pattern of a semiconductor memory device according to another embodiment of the present invention, which is similar to the memory device of FIG. 6.

FIG. 11 shows a memory device which is similar to that of FIG. 6. The device has a portion 102 for transferring into a floating gate the amount of charges which correspond to an input logic value. This portion 102 is at a position different from that of the channel region of a floating gate transistor. A conductive layer 65 is formed on the insulating layers 61, 63 and 100 and overlaps the respective regions 51, 56 and 53 which are formed below the layers 61, 63 and 100. The layer 100 is made of an oxide and 100 Å or less thick (as thick as the insulating layer 63). A tunnel current flows through this layer 100 when the memory device is erased or programmed. The layer 61 is also made of an oxide and as thick as the insulating layer 69. No tunnel current can pass through it.

Indeed the device of FIG. 11 occupies more area than the device of FIG. 6, by 10% to 20%, but it can achieve the effects described with reference to FIG. 10. The insulating layers 63, 100 can easily be made to have the same thickness since they are made by thermally oxidizing the regions 56, 63 which have the same N+ concentration. Further, the ratio of the capacitance defined by the layer 56 and region 53 to the capacitance defined by the layer 65 and region 51, which is a very important factor to the characteristics of the device, can be determined by only the area ratio described in conjunction with the device of FIG. 6. Moreover, since the layer 61 is as thick as the layer 69, the manufacturing process is simpler than otherwise. In short, the characteristics of the memory device are little influenced by the changes or modifications of the manufacturing process.

What is claimed is:

1. A floating gate transistor comprising:
   a semiconductor substrate of a first conductivity type;
   first and second regions of a second conductivity type respectively formed as source and drain regions in the surface area of said substrate;
   a third region of the second conductivity type formed as a first control gate electrode in the surface area of said substrate;
   a first insulating layer formed on that portion of said substrate which lies between said first and second regions;
   a second insulating layer formed on said third region;
   a first conductive layer formed as a floating gate electrode on said first and second insulating layers;
   a third insulating layer formed on said floating gate electrode; and
   a second conductive layer formed as a second control gate electrode on said third insulating layer and electrically connected to said third region.

2. A semiconductor memory device according to claim 1, wherein said semiconductor substrate is formed of a monocrystalline silicon, and said first and second insulating layers are formed of a monocrystalline silicon oxide.

3. A semiconductor memory device according to claim 2, wherein said first conductive layer is formed of a polycrystalline silicon, and said third insulating layer is formed of a polycrystalline silicon oxide.

4. A semiconductor memory device according to claim 3, wherein said first and second insulating layers are formed with a thickness of not more than 100 Å.

5. A semiconductor memory device comprising:

a semiconductor substrate of a first conductivity type;
a floating gate transistor including first and second regions of a second conductivity type respectively formed as source and drain regions in the surface area of said substrate, a third region of the second conductivity type formed as a first control gate electrode in the surface area of said substrate, a first insulating layer formed on that portion of said substrate which lies between said first and second regions, a second insulating layer formed on said third region, a first conductive layer formed as a floating gate electrode on said first and second insulating layers, a third insulating layer formed on said floating gate electrode, and a second conductive layer formed as a second control gate electrode on said third insulating layer and electrically connected to said third region;
a select transistor including fourth and fifth regions of the second conductivity type formed in the surface area of said substrate, a fourth insulating layer formed on that portion of said substrate which lies between said fourth and fifth regions, and a third conductive layer formed as a select gate electrode on said fourth insulating layer; and
means for applying a voltage between said second region and the junction of said second conductive layer and third region through the current path of said select transistor to cause charge carriers to tunnel to and from said floating gate electrode through said first insulating layer.

6. A semiconductor memory device according to claim 5, wherein said second and fourth regions are formed in contact with each other.

7. A semiconductor memory device according to claim 5 wherein said semiconductor substrate is formed of a monocrystalline silicon, and said first and second insulating layers are formed of a monocrystalline silicon oxide.

8. A semiconductor memory device according to claim 7, wherein said first conductive layer is formed of a polycrystalline silicon, and said third insulating layer is formed of a polycrystalline silicon oxide.

9. A semiconductor memory device according to claim 8, wherein said first and second insulating layers are formed with a thickness of not more than 100 Å.

10. A semiconductor memory device comprising:
a semiconductor substrate of a first conductivity type;
a floating gate transistor including first and second regions of a second conductivity type formed as source and drain regions in the surface area of said substrate, a third region of the second conductivity type formed as a control gate electrode in the surface area of said substrate, a first insulating layer of a first thickness formed on that portion of said substrate which lies between said first and second regions, second and third insulating layers each having a second thickness less than said first thickness and formed on the respective second and third regions, and a first conductive layer formed as a floating gate electrode on said first, second and third insulating layers;
a select transistor including fourth and fifth regions of the second conductivity type formed as source and drain regions in the surface area of said substrate, a fourth insulating layer of the first thickness formed on that portion of said substrate which lies between said fourth and fifth regions, and a second conductive layer formed as a select gate electrode on said fourth insulating layer; and
means for applying a voltage between said second and third regions through the current path of said select transistor to cause charge carriers to tunnel to and from said floating gate electrode through said second insulating layer.

11. A semiconductor memory device according to claim 10, wherein said second and fourth regions are formed in contact with each other.

12. A semiconductor memory device according to claim 10, wherein said semiconductor substrate is formed of a monocrystalline silicon, and said first to fourth insulating layers are formed of a monocrystalline silicon oxide.

13. A semiconductor memory device according to claim 12, wherein said second and third layer each have the second thickness of not more than 100 Å.

* * * * *